United States Patent [19]

Rasky et al.

[11] Patent Number: 5,278,871
[45] Date of Patent: Jan. 11, 1994

[54] METHOD AND APPARATUS FOR ESTIMATING SIGNAL WEIGHTING PARAMETERS IN A RECEIVER

[75] Inventors: Phillip D. Rasky, Buffalo Grove; Gregory M. Chiasson, Schaumburg, both of Ill.

[73] Assignee: Motorola, Inc., Schaumburg, Ill.

[21] Appl. No.: 854,506

[22] Filed: Mar. 19, 1992

[51] Int. Cl.$^5$ .............................................. H03D 1/04
[52] U.S. Cl. ......................................... 375/99; 375/58; 455/296
[58] Field of Search ...................... 375/99, 58, 57, 51, 375/101, 80; 455/226.3, 296; 328/165

[56] References Cited

U.S. PATENT DOCUMENTS

| | | |
|---|---|---|
| 4,415,872 | 11/1983 | Karabinis . |
| 4,519,084 | 5/1985 | Langseth . |
| 4,631,735 | 12/1986 | Qureshi .................................. 375/99 |
| 4,763,331 | 8/1988 | Matsumoto . |
| 5,031,195 | 7/1991 | Chevillat et al. ........................ 375/99 |
| 5,157,697 | 10/1992 | Anvari et al. ........................ 375/102 |

Primary Examiner—Stephen Chin
Assistant Examiner—Hai H. Phan
Attorney, Agent, or Firm—Richard A. Sonnentag

[57] ABSTRACT

A receiver (100) has improved signal weighting parameter estimation. The receiver receives a signal (101) having encoded data. A decision circuit (106) is coupled to the received encoded data to generate a first signal weighting parameter which is used to modify the received encoded data. The modified data is then decoded to output the decoded data. The decoded data output is then re-encoded using a technique similar to that used by the transmitter. The re-encoded data is then used to calculate a second signal weighting parameter which, in turn, is used to modify a stored replica of signal (101). The modified version of the stored replica is then decoded to yield a more accurate estimate of the information contained within the signal (101) at a receiver (100).

35 Claims, 2 Drawing Sheets

METHOD AND APPARATUS FOR ESTIMATING SIGNAL WEIGHTING PARAMETERS IN A RECEIVER

RELATED INVENTION

Reference is made to U.S. patent application (Ser. No. 07/854,511), "Method and Apparatus for Estimating Signal Weighting Parameters in a Diversity Receiver" in behalf of Rasky et al., filed on the same date herewith, containing related subject matter and assigned to the assignee of the present invention.

FIELD OF THE INVENTION

This invention relates generally to estimation of signal parameters in a receiver and more specifically to the estimation of signal parameters in a receiver for use in soft-decision decoding.

BACKGROUND OF THE INVENTION

Soft-decision decoding is widely used within digital communications due to the performance gains which result from considering channel information within the decoding process. In order to realize the entire available gain, accurate information about a channel, or a signal transmitted, must be available to the receiver. However, since the structure of the channel is typically unknown, the channel parameters required to realize the entire available gain must be estimated by the receiver.

For an arbitrary binary communication channel with time-varying channel gain and noise variance, the channel can be modeled as:

$$r = p_o x_s + n \qquad (1)$$

where r is the received signal vector, $p_o$ is the channel gain (diagonal) matrix, $x_s$ is the transmitted signal vector, and n is is noise vector. Typically, a maximum likelihood decoder attempts to find the value of s, where s is some sequence, for which the probability density function of the vector (given that $x_s$ was transmitted) is largest. At this point, the maximum likelihood decoder declares that $x_s$ was the transmitted message.

Since the probability density function of the vector r is a function of both the channel gain and the noise variance, it is apparent that an accurate estimate of both the channel gain and the noise variance is required if valid soft-decision information is to be determined. However, the validity of the estimates of the channel gain and the noise variance is directly related to the accuracy of the estimates of the variance of the received signal power, $\sigma_r^2(k)$, and the variance of the received error signal, $\sigma_e^2(k)$, with respect to transmitted signal $x_s(k)$. While $\sigma_r^2(k)$ is simply related to the received signal power, $\sigma_e^2(k)$ is not as easy to obtain since, at the receiver, the transmitted sequence $x_s(k)$ is not available. Current techniques attempt to circumvent this problem by assuming that for a specific symbol in the received sequence of the signal, the error signal is the difference between the received signal and the closest constellation point (CCP). While this technique is adequate if the CCP corresponds to the transmitted signal, in cases where it does not (i.e., the channel has caused an error), the estimate of $\sigma_e^2(k)$ can be highly inaccurate.

Thus, a need exists for a new method and apparatus for estimating the variance of the received error signal $\sigma_e^2(k)$ which provides a significant increase in accuracy by fully utilizing the information available at the receiver.

SUMMARY OF THE INVENTION

A communication system has a transmitter and a receiver, the transmitter transmitting a signal having undergone encoding at the transmitter. The signal has data contained within the signal. The receiver receivers the encoded signal, generates at least a first signal weighting parameter related to the encoded signal and modifies the received encoded signal with the at least a first generated signal weighting parameter related to the signal. The receiver then decodes the modified received encoded signal to produce a first decoded signal, re-encodes the first decoded signal, and generates at least a second signal weighting parameter related to the signal utilizing the re-encoded signal.

DETAILED DESCRIPTION OF A PREFERRED EMBODIMENT

Figure 1:
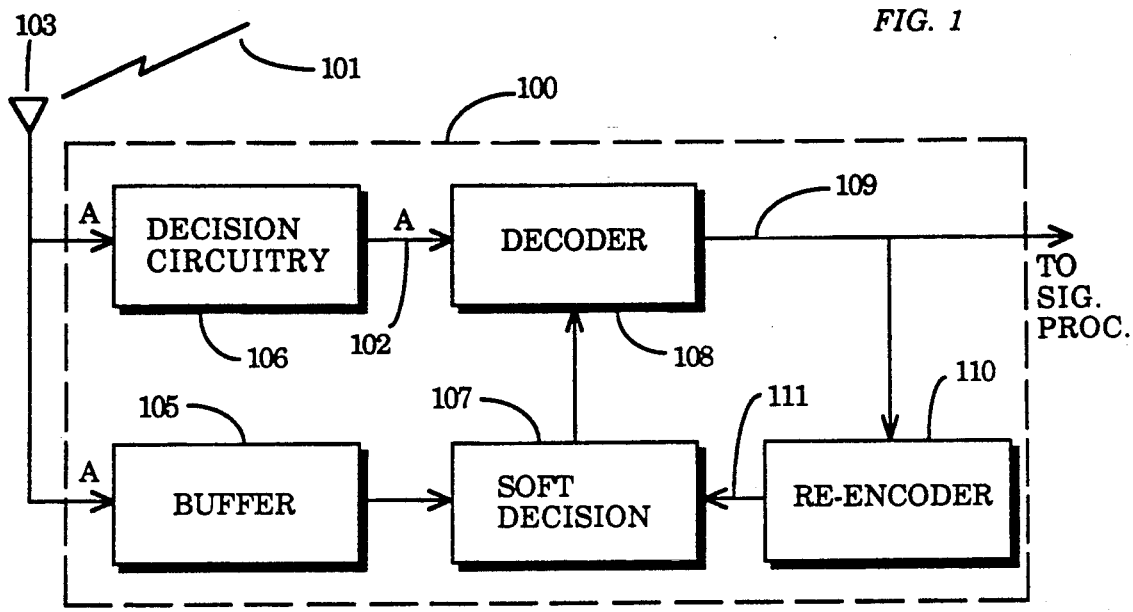
FIG. 1 generally depicts, in block diagram form, a generic receiver which implements improved parameter estimation in accordance with the invention.

FIG. 1 generally depicts, in block diagram form, a generic receiver which implements improved parameter estimation in accordance with the invention. Links denoted by A in FIG. 1 are used only in the initial iteration. The receiver 100 receives a signal 101 transmitted by a transmitter (not shown). Signal 101 is an encoded signal, where in the preferred embodiment, the encoding includes an interleaving process. Signal 101 is received by an antenna 103 and input into decision circuitry 106. Decision circuitry 106 transforms the received signal into an received encoded vector 102 which represents signal 101 in vector form. Decision circuitry 106 is comprised of all necessary demodulation hardware and also performs hard-decision making or soft-decision making.

Figure 2:
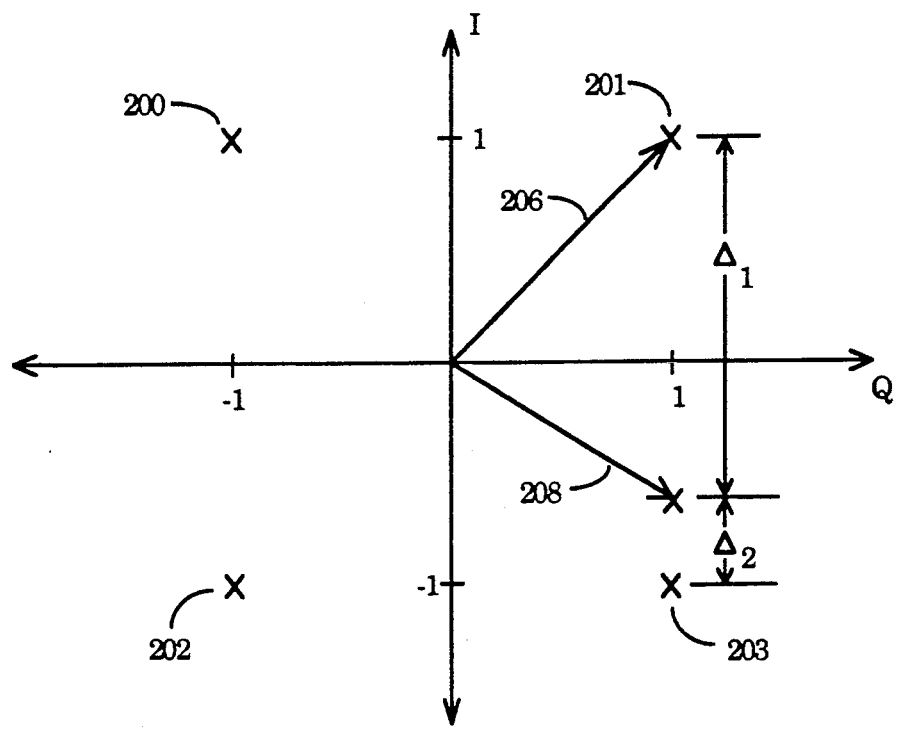
FIG. 2 generally depicts an I-Q constellation which may be used to represent a signal after demodulation.

FIG. 2 generally depicts an I-Q constellation which may be used to represent signal 101 after demodulation. In the preferred embodiment, the constellation depicted in FIG. 2 is for a quaternary phase-shift keying (QPSK) or quaternary amplitude modulation (QAM) modulated signal 101. However, alternate embodiments may employ other types of modulation such as, inter alia, BPSK, 8PSK, 16QAM. As depicted in FIG. 2, the I-Q constellation is comprised of four constellation points 200–203 which represent the four possible hard-decisions which may be output by decision circuitry 106 if hard-decision making is employed. Also depicted in FIG. 2 is the transmitted signal 101 depicted in vector form by vector 206. Vector 206 represents the ideal transmission and the transmission that receiver 100 would receive in ideal situations. However, due to errors introduced by the corresponding channel, a typical vector r received by receiver 100 is vector 208. Vector 208 represents what receiver 100 received, and thus what it thinks is correct. Obviously, if vector 206 represents the signal transmitted, and vector 208 represents what the receiver 100 received (i.e., thinks was transmitted), considerable error is introduced by both the propagation medium and receiver 100.

Soft-decision making in receiver 100 is helpful in decoder 108 in mitigating the errors introduced by the propagation medium and receiver 100. At this point, a brief overview of soft-decision decoding theory is instructive. Recall that an arbitrary binary communication channel with time-varying channel gain and noise variance can be modeled as $$r = p_o x_s + n$$

where r is the received signal vector, $p_o$ is the channel gain (diagonal) matrix, $x_s$ is the transmitted signal vector, and n is the noise vector. Also, if the probability density function of the vector r given that $x_s$ was transmitted is $Q(r|s)$, when given the received signal vector r, the maximum likelihood decoder finds the value of s for which $Q(r|s)$ is largest and declares that $x_s$ was the transmitted signal. In order to further define the structure of the soft-decision decoder, several assumptions are made. First, assume that each element, or symbol k, of $x_s$, denoted by $x_s(k)$, is an independent identically distributed (i.i.d.) binary random variable taking values $\pm\sqrt{c}$ with equal probability. Also, assume that each element of the noise vector n is an independent Gaussian random variable with zero mean and variance $\sigma_n^2(k)$. With this assumption, $$Q(r|s) = \prod_k \frac{1}{\sqrt{2\pi}\,\sigma_n(k)} \exp\left(-\frac{(r(k) - p_o(k)x_s(k))^2}{2\sigma_n^2(k)}\right) \quad (2)$$

where the channel gain has been included with the transmitted sequence in order to facilitate the modeling of this channel.

Since the natural logarithm function is monotonically increasing, maximizing $Q(r|s)$ is equivalent to maximizing $$\ln Q(r|s) = \ln \prod_k \frac{1}{\sqrt{2\pi}\,\sigma_n(k)} \exp\left(-\frac{(r(k) - p_o(k)x_s(k))^2}{2\sigma_n^2(k)}\right) \quad (3)$$

$$\ln Q(r|s) = \sum_k \ln \frac{1}{\sqrt{2\pi}\,\sigma_n(k)} - \sum_k \left(\frac{(r(k) - p_o(k)x_s(k))^2}{2\sigma_n^2(k)}\right)$$

$$\ln Q(r|s) = \sum_k \ln \frac{1}{\sqrt{2\pi}\,\sigma_n(k)} -$$

$$\sum_k \left(\frac{(r^2(k) - 2r(k)p_o(k)x_s(k) + p_o^2(k)x_s^2(k))}{2\sigma_n^2(k)}\right)$$

Now, recalling that $x_s^2(k) = c$, all terms which do not explicitly depend on $x_s(k)$ can be neglected since they do not affect the decision of the decoder. Thus, the maximum likelihood decoder seeks the value of s which maximizes:

$$\sum_k \frac{p_o(k)}{\sigma_n^2(k)} r(k) x_s(k) \quad (4)$$

where the weighting parameter $\alpha(k)$, in the preferred embodiment, for signal 101 is given by:

$$\alpha(k) = \frac{p_o(k)}{\sigma_n^2(k)} \quad (5)$$

In alternate embodiments, other methods for combining the channel gain, $p_o(k)$, and noise variance, $\sigma_n^2(k)$, to form signal weighting parameter $\alpha(k)$ may be employed. Likewise, parameters other than channel gain $p_o(k)$ and noise variance $\sigma_n^2(k)$ may be utilized to calculate signal weighting parameter $\alpha(k)$.

Continuing, as previously indicated, accurate estimates of the channel gain $p_o(k)$ and noise variance $\sigma_n^2(k)$ are necessary if valid soft-decision information is to be determined. To better understand the improved estimation techniques in accordance with the invention, a short review of current estimation techniques is instructive. Assume that all signals are real values. At the receiver, only the received signal r(k) is available. Noting that r(k) has zero mean, it is possible to define the received signal variance as:

$$\sigma_r^2(k) = E[r^2(k)]$$

$$\sigma_r^2(k) = E[(p_o(k)x_s(k) + n(k))^2]$$

$$\sigma_r^2(k) = E[p_o^2(k)x_s^2(k)] + E[2p_o(k)x_s(k)n(k)] + E[n^2(k)] \quad (6)$$

Taking the expectations, recalling that n(k) and $x_s(k)$ are independent and zero mean, yields:

$$\sigma_r^2(k) = c p_o^2(k) + \sigma_n^2(k) \quad (7)$$

Define the error signal as $e_s(k) = r(k) - x_s(k)$, then in the same manner as for the received signal variance $\sigma_r^2(k)$, the variance of the error signal $\sigma_e^2(k)$ may be determined as:

$$\sigma_e^2(k) = E[e_s^2(k)] \quad (8)$$
$$\sigma_e^2(k) = E[(r(k) - x_s(k))^2]$$

$$\sigma_e^2(k) = c(p_o(k) - 1)^2 + \sigma_n^2(k)$$

Now a straight forward algebraic manipulation of (7) and (8) yields:

$$p_o(k) = \frac{\sigma_r^2(k) - \sigma_e^2(k) + c}{2c} \quad (9)$$

and using this result $$\sigma_n^2(k) = \sigma_r^2(k) - c p_o^2(k). \quad (10)$$

The calculation of the expectations is taken over a number of bits for which the channel gain and noise variance parameters do not vary appreciably. In the preferred embodiment, the communication system is a slow-frequency hopping (SFH) code-division multiple access (CDMA) communication system where the number of bits for which the channel gain and noise variance parameters don't vary appreciably is the period of a single frequency hop. For a background on frequency hopping in communication systems, reference is made to George Calhoun, *Digital Cellular Radio*, U.S.A., 1988 at pages 344–351. Continuing, in alternate embodiments, the communication system may be, inter alia, a continuous data communication system or a time-division multiple access (TDMA) communication system. Specifically for TDMA communication systems, the number of bits for which the channel gain and noise variance parameters don't vary appreciably may be the entire period of a timeslot for short timeslot systems. One such system is the Groupe Special Mobile (GSM) Pan-European Digital Cellular System. For other TDMA systems having longer timeslots, for example the United States Digital Cellular (USDC) System, a "windowing" technique may be employed to minimize parameter variation during the period of the expectation as required. Several common windowing techniques include, inter alia, rectangular windowing and exponential decay windowing.

Recall that the error signal is given by $e_s(k)$, and the ideal transmitted signal $x_s(k)$ is given by vector 206 of FIG. 2. If the channel is severely corrupted, the received signal r(k) could be the vector 208. Typically, receivers assume that for a given symbol k in a data sequence, the error signal is the difference between the received signal and the closest constellation point (CCP). Thus, referring to FIG. 2, if the received signal r(k) is vector 208, a typical receiver's estimation of the error signal would be $\Delta_2$, since it is closest to constellation point 203. However, the constellation point which should be used, as it corresponds to the ideal transmitted vector 206, is constellation point 201. This being the case, the actual error in the receiver is $\Delta_1$ and not $\Delta_2$. This type of discrepancy, between the error the receiver thinks it sees and what it should see, is what the present invention seeks to improve.

Now referring back to FIG. 1, output from decision circuitry 106 is received encoded vector 102 which may be weighted (for example by CCP soft-decision making) or may not be weighted (hard-decision making). Received encoded vector 102 is input into a decoder 108, which in the preferred embodiment includes de-interleaving and Viterbi decoding. In alternate embodiments, many types of error correction codes, and consequently decoders, may be incorporated. Referring back to FIG. 2, the error in the receiver, assuming vector 206 is what was actually transmitted and vector 208 represents what receiver 100 thinks was transmitted, is represented by $\Delta_2$. If this error signal were used to calculate the variance of the error signal for later use in calculating the signal weighting parameter $\alpha(k)$, the weighting of signal 101 in receiver 100 would be grossly inaccurate. Referring back to FIG. 1, output from decoder 108 is a decoded received vector 109 which, by virtue of the error correction coding in decoder 108, has fewer errors than does received encoded vector 102. Decoded received vector 109, which after the initial iteration is a first decoded received vector, is then re-encoded in accordance with the invention. In the preferred embodiment, the re-encoder 110 re-encodes the first decoded received vector in a manner using the same technique as that used by the transmitter (not shown).

Output from re-encoder 110 is modified received vector 111, which, after this first iteration, is a first modified received vector. Modified received vector 111 is a better estimate of signal 101 than is received encoded vector 102. Modified received vector 111 enters soft-decision block 107 where a signal weighting parameter $\alpha(k)$ is calculated using modified received vector 111. Since, at this point, modified received vector 111 contains information about signal 101, receiver 100 knows that the CCP technique used initially was incorrect. Receiver 100 corrects for this by now using constellation point 201 for calculation of signal weighting parameter $\alpha(k)$, thus giving a more accurate estimate of transmitted signal $x_s(k)$ represented by vector 206. In the preferred embodiment, signal weighting parameter $\alpha(k)$ is a soft-decision weighting parameter, which will be used to further weight or modify a stored replica of signal 101. At this time, the newly calculated signal weighting parameter represents a second signal weighting parameter. Calculation of the second signal weighting parameter is performed in soft-decision block 107 using modified received vector 111 where it is used to modify a stored replica of signal 101 retrieved from buffer 105. The modified stored replica is then decoded, resulting at this point in a second decoded received vector. By virtue of the first iteration through re-encoder 110 and soft decision block 107 the second decoded received vector has fewer errors than the first decoded received vector 109 since the first iteration allowed receiver 100 to learn information about signal 101, and more specifically about the data contained within signal 101. By iterating in this manner, receiver 100 is able to make a better estimate of what signal 101 looked like, and can thus more accurately reconstruct signal 101 at receiver 100.

A first iteration through the re-encoder 110 and into soft-decision block 107 will obviously help receiver 100 learn more about signal 101. However, although it may be adequate, receiver 100 is not limited to only a single iteration. In fact, each time receiver 100 undergoes an iteration, it corrects more and more of the errors introduced by both the propagation medium and receiver 100 with respect to signal 101. At some number of iterations, however, the amount of errors that decoder 108 is able to correct will decrease and will eventually reach a point of diminishing return since receiver 100 will reach a point where there are no longer any errors possible for receiver 100 to correct with respect to signal 101. The number of iterations that receiver 100 undergoes is dependent upon the performance requirements of receiver 100.

In an alternate embodiment, receiver 100 could have a limited amount of knowledge about signal 101, specifically about data contained within signal 101. For example, signal 101 could be a burst signal within a time-division multiple access (TDMA) communication system which has a fully-known amount of information. This information may be, but is not limited to, continuous sequences such as a preamble, midamble, or a postamble. In this scenario, receiver 100 would use the fully-known amount of information as the estimate of $x_s$ in the determination of the error signal and, consequently, improve the accuracy of the signal weighting parameter. The receiver 100 would use the fully-known amount of information in place of the corresponding $x_s(k)$ sequence for these bits. This would result in the generation of completely accurate soft-decision information over the span of these bits. This information could be combined with signal weighting parameters derived from the unknown data bits using the previously discussed CCP techniques to form a signal weighting parameter which would be used to scale signal 101 in the first decoding iteration. In latter iterations, the signal weighting parameter from the known data bits could be combined with weighting parameters derived from the unknown data bits using the previously discussed re-encoding technique.

In another embodiment, signal 101 could be a signal which has a partially-known amount of information, for example, inter alia, a digital voice color code (DVCC) sequence. In this scenario, the soft-decision information may not be as accurate since the receiver does not explicitly know the corresponding $x_s(k)$ sequence; it simply knows that these symbols belong to a particular subset. Consequently, the signal weighting parameters would be calculated via a modified technique in which the error signal and hence the signal weighting parameter would be calculated in the previously described manner for the unknown data bits while for the partially known bits the error term and hence the signal weighting parameter would be calculated using only the constellation points within the set of allowable values. These two weighting parameters would then be combined to form a signal weighting parameter which would be used to scale signal 101.

Figure 3:
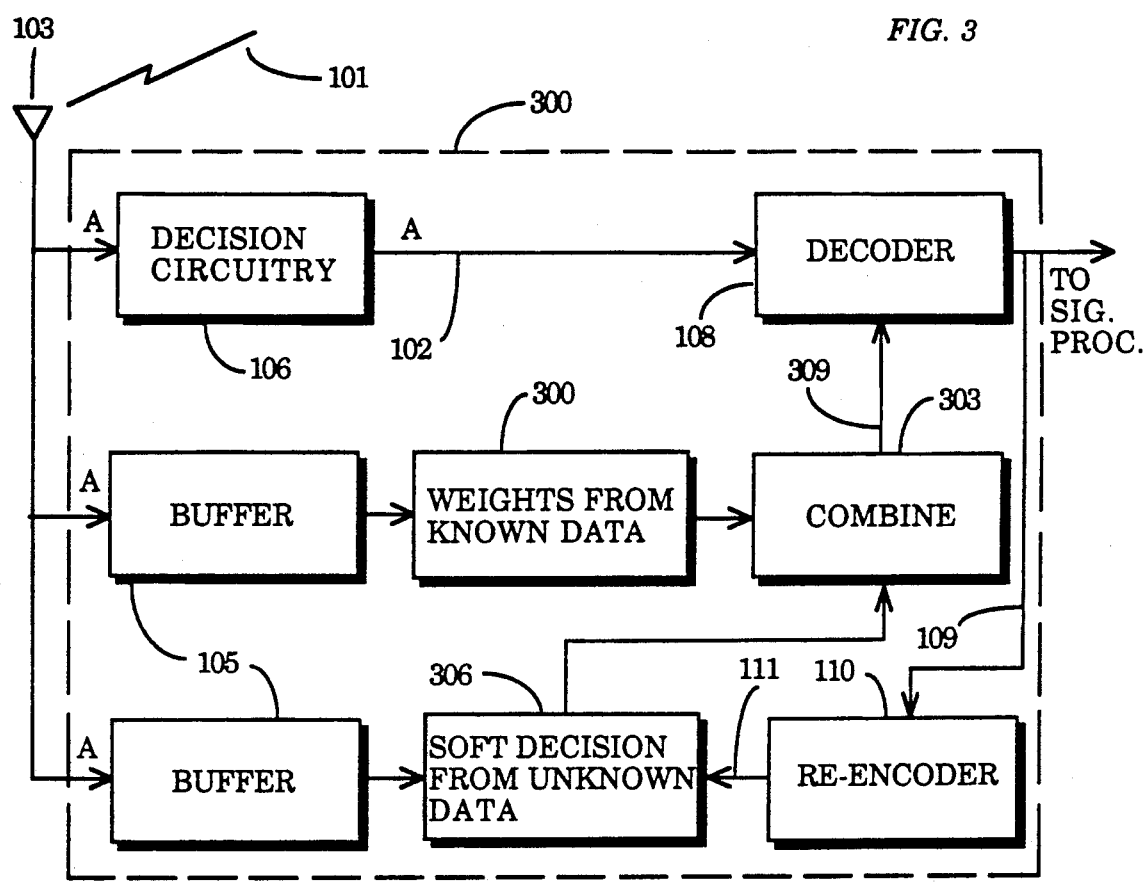
FIG. 3 generally depicts, in block diagram form, a generic receiver implementing known and unknown data for improved parameter estimation in accordance with the invention.

FIG. 3 generally depicts, in block diagram form, a generic receiver 300 implementing fully-known or partially-known data and unknown data for improved parameter estimation in accordance with the invention. As depicted in FIG. 3, signal 101, antenna 103, buffer 105, decision circuitry 106, decoder 108, and re-encoder 110 may be the same as those shown in FIG. 1. During a first iteration, signal 101 enters antenna 103 where signal 101 is routed to decision circuitry 106 and a first signal weighting parameter is generated. In the preferred embodiment, the first signal weighting parameter is a soft-decision weighting parameter. In alternate embodiments, however, first signal weighting parameter may be the result of a hard-decision. Continuing, decision circuitry 106 transforms the received signal into an received encoded vector 102 which represents signal 101 in vector form. Received encoded vector 102 is then input into decoder 108 where it is decoded. Output from decoder 108 is a first decoded signal 109 which is re-encoded by re-encoder 110. Output from re-encoder 110 is modified received vector 111, which, after this first iteration, is a first modified received vector. It is at this point where the operation of receiver 300 deviates from that of receiver 100 of FIG. 1. As depicted in FIG. 3, signal 101 is stored in buffer 105 which is physically the same buffer but is separated in FIG. 3 for convenience. Since signal 101 has either fully-known or partially-known data, the weights from this known data can be calculated in block 300 directly from a stored replica of signal 101. However, since there are a remainder of unknown bits, to obtain an estimate of these unknown bits, modified received vector 111 is combined with the unknown bits stored in buffer 105 to generate weights from the unknown bits. This is done in block 306. Outputs from block 300 and 306 are then combined in combine block 303 to yield a second signal weighting parameter which has essentially modified a stored replica of received signal 101. Output from combine block 303 is a modified received signal 309 which is then re-decoded to produce a second decoded signal having additional information about data contained within signal 101.

What we claim is:

1. In a communication system having a transmitter and a receiver, the transmitter transmitting a signal having undergone encoding at the transmitter, the signal having data contained within the signal, a method of estimating signal weighting parameters in the receiver, the method comprising the steps of:

receiving the encoded signal;
generating a first signal weighting parameter related to the received encoded signal;
modifying the received encoded signal with said first generated signal weighting parameter;
decoding the modified received encoded signal to produce a first decoded signal;
re-encoding the first decoded signal to produce a re-encoded signal; and
generating a second signal weighting parameter related to said re-encoded signal.

2. The method of claim 1 further comprising the steps of:

modifying a stored replica of the received encoded signal with said second generated signal weighting parameter; and
decoding the modified stored replica of the received encoded signal to produce a second decoded signal.

3. The method of claim 2 wherein said second decoded signal is utilized to reconstruct the transmitted signal in the receiver.

4. In a communication system having a transmitter and a receiver, the transmitter transmitting a signal having undergone encoding at the transmitter, a method of estimating signal weighting parameters in a receiver, the method comprising the steps of:

receiving the encoded signal;
transforming said received encoded signal into a received encoded vector representing the encoded signal;
generating a first signal parameter related to the received encoded vector;
modifying said received encoded vector with said first signal weighting parameter;
decoding said modified received encoded vector to produce a first decoded received vector;
re-encoding said first decoded received vector to produce a re-encoded received vector;
generating a second signal weighting parameter related to the re-encoded received vector;
modifying a stored replica of said received encoded vector with said second signal weighting parameter; and
decoding said modified stored replica of said received encoded vector to produce a second decoded received vector.

5. The method of claim 4 wherein said first and second signal weighting parameters each further comprises a soft-decision weighting parameter.

6. The method of claim 4 wherein encoding comprises forward error correction encoding.

7. The method of claim 4 wherein each step of decoding further comprises the step of one of either hard-decision decoding or soft-decision decoding.

8. The method of claim 4 wherein each step of decoding is performed by a Viterbi decoding algorithm.

9. The method of claim 4 wherein said step of decoding said received encoded vector further comprises a step of closest constellation point (CCP) soft-decision decoding.

10. The method of claim 4 wherein said step of re-encoding is a coding technique similar to that used by the transmitter.

11. The method of claim 4 wherein said second decoded received vector has fewer errors than said first decoded received vector.

12. The method of claim 11 wherein said second decoded received vector is further utilized to reconstruct the transmitted signal at the receiver.

13. The method of claim 4 wherein said steps of re-encoding, modifying a stored replica of said received encoded vector and decoding said modified stored replica of said received encoded vector to produce a second decoded received vector may be iterated to produce a decoded signal containing additional information about data contained within the signal.

14. A method of signal estimation in a receiver, the receiver having received a signal from a transmitter, the receiver weighting the signal by calculating soft-decision weighting parameters in response to the received signal, the method comprising the steps of:

transforming the received signal into a received vector representing the received signal;

calculating a first error signal between said received transformed vector and a predetermined vector which represents an ideally transmitted signal;

modifying said received transformed vector with a first soft-decision weighting parameter generated based on said first error signal;

decoding said modified received vector to produce a first decoded received vector;

re-encoding said first decoded received vector to produce a first re-encoded received vector;

calculating a second error signal between said re-encoded received vector and said received signal;

modifying the received signal with a second soft-decision weighting parameter generated based on said second error signal to produce a modified received signal; and decoding said modified received signal to produce a second decoded received vector.

15. The method of claim 14 wherein said step of modifying the received signal with a second soft-decision weighting parameter further comprises the step of modifying a stored replica of the received signal with a second soft-decision weighting parameter.

16. The method of claim 14 wherein said step of calculating said first error signal further comprises the steps of calculating:

a variance of said received vector;

a variance of said first error signal; and a channel gain and a noise variance based on said calculated variance of said received vector and said calculated variance of said first error signal.

17. The method of claim 16 wherein said steps of calculating are performed over a number of bits for which said channel gain and said noise variance do not vary appreciably.

18. The method of claim 16 wherein at least one of said calculated channel gain or said calculated noise variance is used to weight the received signal in the receiver.

19. In a communication system having a transmitter and a receiver, the transmitter transmitting a signal having data contained therein, the receiver having a limited amount of information about the data, a method of estimating signal weighting parameters in the receiver, the method comprising the steps of:

receiving the signal;

generating a first signal weighting parameter related to the received signal;

modifying the received signal with said first generated signal weighting parameter related to the received signal;

decoding the modified received signal to produce a first decoded signal;

re-encoding the first decoded signal;

generating a second signal weighting parameter related to the signal utilizing said re-encoded signal;

modifying the received signal with said second generated signal weighting parameter; and re-decoding the modified received signal modified with said second generated signal weighting parameter to produce a second decoded signal having additional information about data contained within the signal.

20. The method of claim 19 wherein said step of modifying the received signal with a second generated signal weighting parameter further comprises the step of modifying a stored replica of the received signal with a second generated signal weighting parameter.

21. The method of claim 19 wherein said second decoded signal is utilized to reconstruct the transmitted signal in the receiver.

22. The method of claim 19 wherein said steps of re-encoding, generating a second signal weighting parameter, modifying the received signal with said second generated signal weighting parameter, and re-decoding may be iterated to produce a decoded signal containing additional information about data contained within the signal.

23. The method of claim 19 wherein said limited amount of information further comprises a fully-known amount of information contained within the signal.

24. The method of claim 19 wherein said limited amount of information further comprises a partially-known amount of information contained within the signal.

25. The method of claim 19 wherein said second signal weighting parameter may be generated from a combination of a fully-known amount of data or a partially-known amount of data and a remainder of unknown bits.

26. An apparatus for estimating signal weighting parameters in a receiver, the apparatus comprising:

means for receiving an encoded signal transmitted from a transmitter;

first means, coupled to said means for receiving, for making signal weighting parameter decisions based on said received encoded signal;

means, coupled to said means for making decisions, for decoding said received signal based on said signal weighting parameter decisions;

means, coupled to said means for decoding, for re-encoding said decoded received signal; and second means, coupled to said means for re-encoding and said received encoded signal, for making signal weighting parameter decisions based on said re-encoded received encoded signal.

27. The apparatus of claim 26 wherein said first means for making signal weighting parameter decisions further comprises means for making one of either a hard-decision or a soft-decision.

28. The apparatus of claim 26 wherein said means for decoding further comprises a Viterbi decoder.

29. The apparatus of claim 26 wherein said second means for making signal weighting parameter decisions based on said re-encoded received encoded signal further comprises means for weighting said received encoded signal with said signal weighting parameter decisions to produce a signal utilized to reconstruct the transmitted signal in the receiver.

30. A receiver for estimating signal weighting parameters, the receiver employed in a slow-frequency hopping (SFH) communication system, the receiver comprising:
- means for receiving a frequency-hopped signal transmitted from a transmitter;
- first means, coupled to said means for receiving, for making signal weighting parameter decisions based on said received frequency-hopped signal;
- means, coupled to said means for making decisions, for decoding said received frequency-hopped signal based on said signal weighting parameter decisions,
- means, coupled to said means for decoding, for re-encoding said decoded received frequency-hopped signal; and
- second means, coupled to said means for re-encoding and said received frequency-hopped signal, for making signal weighting parameter decisions based on said re-encoded received frequency-hopped signal.

31. The receiver of claim 30 wherein said receiver is employed in a code-division multiple access (CDMA) communication system.

32. A receiver for estimating signal weighting parameters, the receiver employed in a time-division multiple access (TDMA) communication system, the receiver comprising:
- means for receiving an encoded signal, transmitted from a transmitter, during a first TDMA timeslot;
- first means, coupled to said means for receiving, for making signal weighting parameter decisions based on said received encoded signal;
- means, coupled to said means for making decisions, for decoding said received encoded signal based on said signal weighting parameter decisions;
- means, coupled to said means for decoding, for re-encoding said decoded received encoded signal; and
- second means, coupled to said means for re-encoding and said received encoded signal, for making signal weighting parameter decisions based on said re-encoded received encoded signal.

33. The receiver of claim 32 wherein said first and second means for making signal weighting parameter decisions further comprises first and second means for making signal weighting parameter decisions over a number of bits within the timeslot for which parameters related to said signal weighting parameters do not vary appreciably.

34. The receiver of claim 33 wherein said parameters related to said signal weighting parameters further comprise at least one of either channel gain and noise variance parameters.

35. The receiver of claim 33 wherein a windowing technique may be employed to minimize parameter variation.

* * * * *